US006994944B2

(12) United States Patent  
Nishimura et al.

(10) Patent No.: US 6,994,944 B2  
(45) Date of Patent: Feb. 7, 2006

(54) RADIATION SENSITIVE RESIN COMPOSITION, CATHODE SEPARATOR AND EL DISPLAY DEVICE

(75) Inventors: Isao Nishimura, Chuo-ku (JP); Masayoshi Suzuki, Chuo-ku (JP); Hirofumi Sasaki, Chuo-ku (JP); Kazuaki Niwa, Chuo-ku (JP)

(73) Assignee: JSR Corporation, Tokyo (JP)

( * ) Notice: Subject to any disclaimer, the term of this patent is extended or adjusted under 35 U.S.C. 154(b) by 410 days.

(21) Appl. No.: 09/946,359

(22) Filed: Sep. 6, 2001

(65) Prior Publication Data

US 2002/0055059 A1 May 9, 2002

(30) Foreign Application Priority Data

Sep. 8, 2000 (JP) .............................. 2000-273213

(51) Int. Cl.  
*G03F 7/004* (2006.01)

(52) U.S. Cl. .................. 430/270.1; 430/905; 430/910

(58) Field of Classification Search ............ 430/270.1, 430/905, 910, 926, 24, 28; 313/503, 504  
See application file for complete search history.

(56) References Cited

U.S. PATENT DOCUMENTS

| | | | | |
|---|---|---|---|---|
| 4,889,788 A | * | 12/1989 | Stahlhofen et al. | ......... 430/191 |
| 5,008,175 A | * | 4/1991 | Hsieh et al. | ................. 430/155 |
| 5,017,462 A | * | 5/1991 | Stahlhofen | .................. 430/325 |
| 5,084,372 A | * | 1/1992 | Hsieh et al. | ................. 430/296 |
| 5,529,885 A | | 6/1996 | Ochiai et al. | |
| 5,701,055 A | * | 12/1997 | Nagayama et al. | ......... 313/504 |
| 5,958,648 A | | 9/1999 | Nishimura et al. | |
| 6,048,666 A | | 4/2000 | Niwa et al. | |
| 6,261,738 B1 | * | 7/2001 | Asakura et al. | ........... 430/270.1 |
| 6,351,066 B1 | * | 2/2002 | Gyoutoku et al. | ........... 313/504 |
| 6,455,223 B1 | * | 9/2002 | Hatakeyama et al. | ..... 430/270.1 |
| 6,624,567 B2 | * | 9/2003 | Shirahata et al. | ........... 313/503 |
| 6,756,165 B2 | * | 6/2004 | Nishimura et al. | ........... 430/11 |
| 2002/0055059 A1 | * | 5/2002 | Nishimura et al. | ...... 430/270.1 |

FOREIGN PATENT DOCUMENTS

| | | |
|---|---|---|
| EP | 0 349 265 | 1/1990 |
| EP | 0 594 452 | 4/1994 |
| EP | 0 621 509 | 10/1994 |
| EP | 0 732 868 | 9/1996 |
| JP | 02-066873 | 3/1990 |
| JP | 05-258859 | 10/1993 |
| JP | 05-275172 | 10/1993 |
| JP | 05-2558860 | 10/1993 |
| JP | 08-315981 | 11/1996 |

OTHER PUBLICATIONS

Derwent Abstract, AN 2000-667039 (65), JP 2002-206684, Jul. 28, 2000.

Derwent Abstract, AN 1995-234520 (31), JP 7-140660, Jun. 2, 1995.

* cited by examiner

*Primary Examiner*—John S. Chu  
(74) *Attorney, Agent, or Firm*—Oblon, Spivak, McClelland, Maier & Neustadt, P.C.

(57) ABSTRACT

A radiation sensitive resin composition for the formation of cathode separators for EL display devices which have heat resistance and adhesion required for cathode separators for EL display devices and an inversely tapered shape, cathode separators formed therefrom and an EL display device comprising the cathode separators.

The radiation sensitive resin composition for the formation of cathode separators for EL display devices comprises (A) an alkali soluble resin, (B) the compound represented by the formulae (I) to (IV) and (C) a trihalomethyltriazine and/or an onium salt, the cathode separators are formed from the radiation sensitive resin composition and the EL display device comprises the cathode separators formed from the radiation sensitive resin composition.

4 Claims, No Drawings

RADIATION SENSITIVE RESIN COMPOSITION, CATHODE SEPARATOR AND EL DISPLAY DEVICE

FIELD OF THE INVENTION

The present invention relates to a radiation sensitive resin composition for the formation of cathode separators for EL display devices, a cathode separator and an EL display device. More specifically, it relates to a radiation sensitive resin composition suitable for use as a material for the formation of cathode separators for EL display devices, a cathode separator formed therefrom and an EL display device.

DESCRIPTION OF THE PRIOR ART

Generally speaking, it is difficult to carry out the micro-patterning of the cathode or organic EL layer of an organic EL device due to the low heat resistance (generally 100° C. or less), solvent resistance and moisture resistance of an organic EL material used in an electron transfer layer and emissive layer. For example, when photolithography used for the patterning of a thin film is used for an organic EL device, the characteristics of the organic EL device are deteriorated by the infiltration of a solvent contained in a photoresist into the organic EL device, the infiltration of a high-temperature atmosphere during the baking of the photoresist, a photoresist developer or etchant into the organic EL device and damage caused by plasma at the time of dry etching.

Although patterning may be carried out using a deposition mask, a fine pattern cannot be formed by the inclusion of a deposited product caused by poor adhesion between the mask and a substrate during vapor deposition, a short circuit between a cathode and an anode made of indium tin oxide (to be abbreviated as ITO hereinafter) caused by the damage of an organic EL layer by contact with the mask when the substrate and the deposition mask are closely adhered to each other forcedly, and the deflection of the mask due to insufficient strength in the case of a striped cathode pattern with small masking portions and large openings.

To solve the above problems, the technology disclosed by JP-A 2-66873 (the term "JP-A" as used herein means an "unexamined published Japanese patent application") is to pattern a photoresist comprising a solvent which does not dissolve an organic EL material on the organic EL device and etch a cathode using diluted sulfuric acid. However, the organic EL material is damaged by the diluted sulfuric acid at the time of etching.

The technology disclosed by JP-A 5-275172, JP-A 5-258859 and JP-A 5-258860 is to form cathode separators having a tapered cross section with a height of several to several tens of micrometers and arranged parallel to one another on a substrate after ITO patterning and to deposit an organic EL material and a cathode material from a direction perpendicular to the cathode separators and a direction diagonal to the surface of the substrate on the substrate for patterning. That is, a method of forming a first electrode line and an organic EL material thin film by vacuum deposition in an oblique direction selectively by shutting out a predetermined gas stream with high cathode separators formed at the boundary on the substrate in order to prevent a space between cathode separators from being polluted during deposition. However, in this oblique deposition method, a portion where the organic EL material is not deposited is existent in an opening between cathode separators and the brightness of a display device becomes unsatisfactory. JP-A 8-315981 uses cathode separator having a overhung cross section (trapezoidal with a bottom side shorter than a top side) to enable vacuum deposition from above and eliminate the above defect of oblique deposition. However, generally existing resist materials have low heat resistance and cannot retain an inversely tapered shape due to softening during curing.

When a volatile component derived from the cathode separator material is contained in an EL layer as an impurity, it may cause such a problem as a reduction in the light emitting area of an EL light emitting device or a lighting failure.

Problems to be Solved by the Invention

It is therefore an object of the present invention which has been made in view of the above situation to provide a radiation sensitive resin composition for the formation of cathode separators for EL display devices which have required heat resistance and adhesion and an inversely tapered shape.

It is another object of the present invention to provide a cathode separator formed from the above radiation sensitive resin composition and an EL display device comprising the cathode separators.

Other objects and advantages of the present invention will become apparent from the following description.

According to the present invention, firstly, the above objects and advantages of the present invention are attained by a radiation sensitive resin composition, which comprises:

(A) an alkali soluble resin;

(B) at least one compound selected from the group consisting of a compound represented by the following formula (I):

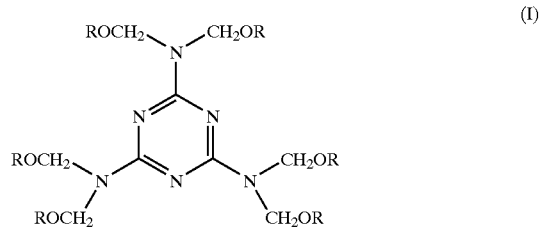

(I)

wherein six Rs may be the same or different and each a hydrogen atom or an alkyl group having 1 to 6 carbon atoms, a compound represented by the following formula (II):

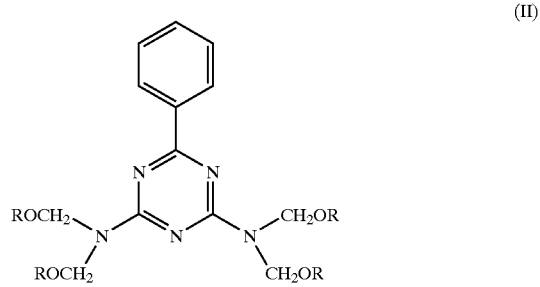

(II)

wherein Rs are defined as above, a compound represented by the following formula (III):

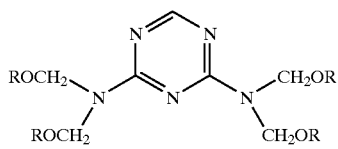
(III)

wherein Rs are defined as above, and a compound represented by the following formula (IV):

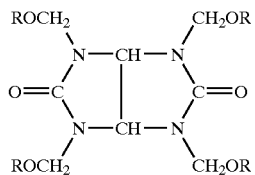
(IV)

wherein Rs are defined as above; and (C) a trihalomethyltriazine represented by the following formula (V):

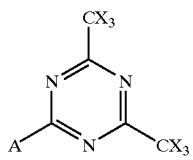
(V)

wherein X is a halogen atom and A is $CX_3$ or a group represented by the following formulas:

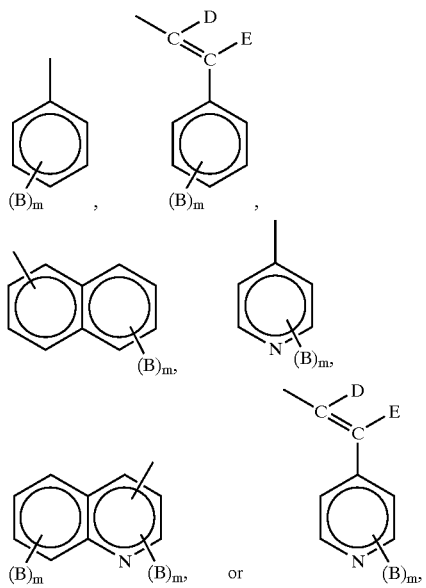

B, D and E are each independently a hydrogen atom, alkyl group, aryl group, alkoxy group, aryloxy group, thioalkyl group or thioaryl group having 1 to 10 carbon atoms, halogen atom, cyano group, nitro group, secondary amino group having an alkyl group with 1 to 10 carbon atoms, carboxyl group, hydroxyl group, ketoalkyl group or ketoaryl group having 1 to 10 carbon atoms, or alkoxycarbonyl group or alkylcarbonyloxy group having 1 to 20 carbon atoms, and m is an integer of 1 to 5, or an onium salt which serves as an optically acid generating agent represented by the following formula (VI):

$$(A)_n Z_+ Y^- \qquad (VI)$$

wherein A is as defined hereinabove, Z is sulfur or iodine, Y is $BF_4$, $PF_6$, $SbF_6$, $AsF_6$, p-toluenesulfonate, trifluoromethane sulfonate or trifluoroacetate, and n is 2 or 3, and which is for formation of cathode separators for EL display devices.

Secondly, the above objects and advantages of the present invention are attained by a cathode separator for EL display devices, which is formed from the above radiation sensitive resin composition.

Thirdly, the above objects and advantages of the present invention are attained by an EL display device comprising the above cathode separators.

The El display device of the present invention comprehends an organic EL display device and an inorganic EL display device. Out of these, the organic EL display device is preferred.

Each component of the radiation sensitive resin composition of the present invention will be detailed hereinbelow.

(A) Alkali Soluble Resin

The alkali soluble resin used in the present invention is not particularly limited if it is alkali-soluble. A novolak resin, a homopolymer of a radical polymerizable monomer having a phenolic hydroxyl group or carboxyl group and a copolymer of the radical polymerizable monomer and another radical polymerizable monomer are preferred as the alkali soluble resin.

The novolak resin is alkali-soluble and is obtained by polycondensing a phenol, preferably a phenol containing m-cresol, and an aldehyde. As the phenol other than m-cresol (to be simply referred to as "phenolic monomer" hereinafter) used in the production of the novolak resin are advantageously used phenol, p-cresol, o-cresol, 2,3-xylenol, 2,5-xylenol, 3,5-xylenol, 2,3,5-trimethylphenol, catechol, resorcinol, hydroquinone, methylhydroquinone, pyrogallol and phloroglucinol. These phenolic monomers may be used alone or in combination of two or more, preferably in combination with m-cresol.

The molar ratio of m-cresol to the phenolic monomer is preferably 20/80 to 100/0, more preferably 30/70 to 100/0. When the amount of m-cresol is smaller than 20 mol %, the resolution of the obtained composition tends to deteriorate.

The phenol is polycondensed with an aldehyde such as formaldehyde or acetaldehyde in the presence of an acid catalyst such as oxalic acid to obtain a novolak resin of interest.

Water is generally used as a reaction medium in the polycondensation reaction. When the phenol used in the polycondensation reaction does not dissolved in an aqueous solution of an aldehyde and a heterogeneous system is formed from the beginning of the reaction, a hydrophilic organic solvent may be used as the reaction medium. Examples of the solvent used in this case include alcohols such as methanol, ethanol and butanol, and cyclic ethers such as tetrahydrofuran and dioxane. The amount of the reaction medium is preferably 20 to 400 parts by weight based on 100 parts by weight of the total of the reaction raw materials.

The polycondensation reaction temperature can be suitably adjusted according to the reactivity of the reaction raw materials but it is preferably 10 to 200° C. After the end of the polycondensation reaction, the novolak resin can be recovered by elevating the temperature to 130 to 230° C. to remove an unreacted raw material, acid catalyst and reaction medium existent in the system and distilling off a volatile component under reduced pressure.

The novolak resin used in the present invention has a weight average molecular weight in terms of standard polystyrene (to be referred to as "Mw" hereinafter) of preferably 2,000 to 30,000, particularly preferably 3,500 to 20,000. When Mw is more than 30,000, the developability of the composition of the present invention may deteriorate and when Mw is less than 2,000, film formation properties may worsen. In the radiation sensitive resin composition of the present invention, the above novolak resins may be used alone or in combination of two or more.

Preferred examples of the radical polymerizable monomer having a phenolic hydroxyl group or carboxyl group used to synthesize a homopolymer of a radical polymerizable monomer having a phenolic hydroxyl group or carboxyl group and a copolymer of the radical polymerizable monomer and another radical polymerizable monomer include o-hydroxystyrene, m-hydroxystyrene, p-hydroxystyrene and alkyl, alkoxy, halogen, haloalkyl, nitro, cyano, amide, ester and carboxy substituted products thereof; polyhydroxyvinyl phenols such as vinylhydroquinone, 5-vinylpyrogallol, 6-vinylpyrogallol and 1-vinylphloroglucinol; o-vinylbenzoic acid, m-vinylbenzoic acid, p-vinylbenzoic acid, and alkyl, alkoxy, halogen, nitro, cyano, amide and ester substituted products thereof; methacrylic acid, acrylic acid, and α-position haloalkyl, alkoxy, halogen, nitro and cyano substituted products thereof; divalent unsaturated carboxylic acids such as maleic acid, maleic anhydride, fumaric acid, fumaric anhydride, citraconic acid, mesaconic acid, itaconic acid, 1,4-cyclohexenedicarboxylic acid, and methyl, ethyl, propyl, i-propyl, n-butyl, sec-butyl, ter-butyl, phenyl, o-, m- and p-toluyl half-ester and half-amide thereof.

Out of these, o-hydroxystyrene, m-hydroxystyrene, p-hydroxystyrene, and alkyl and alkoxy substituted products thereof are preferred from the viewpoints of sensitivity at the time of patterning, resolution, film retention after development, thermal deformation resistance, solvent resistance, adhesion to the base and solution keeping stability.

They may be used alone or in combination of two or more.

Examples of the another radical polymerizable monomer include styrene, α-position, o-position, m-position and p-position alkyl, alkoxy, halogen, haloalkyl, nitro, cyano, amide and ester substituted products of styrene; diolefins such as butadiene, isoprene and chloroprene; methyl, ethyl, n-propyl, i-propyl, n-butyl, sec-butyl, ter-butyl, pentyl, neopentyl, isoamylhexyl, cyclohexyl, adamantyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoroethyl, perfluoroethyl, perfluoro-n-propyl, perfluoro-i-propyl, triphenylmethyl, tricyclo[5.2.1.0$^{2.6}$]decan-8-yl (commonly called "dicyclopentanyl" in this technical field), cumyl, 3-(N,N-dimethylamino)propyl, 3-(N,N-dimethylamino)ethyl, furyl and furfuryl esterified products of methacrylic acid and acrylic acid; anilide, amide, N,N-dimethyl, N,N-diethyl, N,N-dipropyl, N,N-diisopropyl, anthranylamide, acrylonitrile, acrolein, methacrylonitrile, vinyl chloride, vinylidene chloride, vinyl fluoride, vinylidene fluoride, N-vinylpyrrolidone, vinylpyridine, vinyl acetate, N-phenylmaleinimide, N-(4-hydroxyphenyl)maleinimide, N-methacryloylphthalimide and N-acryloylphthalimide of methacrylic acid and acrylic acid. They may be used alone or in combination of two or more.

Out of these, styrene, and α-position, o-position, m-position and p-position, alkyl, alkoxy, halogen and haloalkyl substituted products of styrene; butadiene and isoprene; and methyl, ethyl, n-propyl, N-butyl, glycidyl and dicyclopentanyl esterified products of methacrylic acid and acrylic acid are particularly preferred from the viewpoints of sensitivity at the time of patterning, resolution, film retention after development, thermal deformation resistance, solvent resistance, adhesion to the base and solution keeping stability.

When a copolymer of a radical polymerizable monomer having a phenolic hydroxyl group and another radical polymerizable monomer is used as the alkali soluble resin, the amount of the another radical polymerizable monomer is preferably 30 wt % or less, particularly preferably 5 to 20 wt % based on the total weight of the radical polymerizable monomer having a phenolic hydroxyl group and the another radical polymerizable monomer.

When a copolymer of a radical polymerizable monomer having a carboxyl group and another radical polymerizable monomer is used as the alkali soluble resin, the amount of the another radical polymerizable monomer is preferably 90 wt % or less, particularly preferably 10 to 80 wt % based on the total weight of the radical polymerizable monomer having a carboxyl group and the another radical polymerizable monomer.

When the ratio of the another radical polymerizable monomer to the radical polymerizable monomer having a phenolic hydroxyl group or carboxyl group is outside the above range, alkali development may become difficult.

Generally known radical polymerization initiators may be used as the polymerization initiator used in the production of a homopolymer of a radical polymerizable monomer having a phenolic hydroxyl group or carboxyl group or a copolymer of the radical polymerizable monomer and another radical polymerizable monomer, as exemplified by azo compounds such as 2,2'-azobisisobutyronitrile, 2,2'-azobis-(2,4-dimethylvaleronitrile) and 2,2'-azobis-(4-methoxy-2,4-dimethylvaleronitrile; organic peroxides such as benzoyl peroxide, lauroyl peroxide, t-butyl peroxypivalate and 1,1'-bis-(t-butylperoxy)cyclohexane; and hydrogen peroxide. When a peroxide is used as the radical polymerization initiator, the peroxide may be used in conjunction with a reducer as a redox initiator.

Examples of the solvent used in the production of a homopolymer of a radical polymerizable monomer having a phenolic hydroxyl group or carboxyl group or a copolymer of the radical polymerizable monomer and another radical polymerizable monomer include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethylmethyl ether; propylene glycol monoalkyl ethers such as propylene glycol monomethyl ether, propylene glycol monoethyl ether, propylene glycol monopropyl ether and propylene glycol monobutyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

The amount of the solvent is preferably 20 to 1,000 parts by weight based on 100 parts by weight of the total of the reaction raw materials.

The weight average molecular weight in terms of polystyrene of a homopolymer of a radical polymerizable monomer having a phenolic hydroxyl group or carboxyl group or a copolymer of the radical polymerizable monomer and another radical polymerizable monomer is preferably 2,000 to 100,000, more preferably 3,000 to 50,000, particularly preferably 5,000 to 30,000.

When the average molecular weight is smaller than 2,000, the pattern shape, resolution, developability and heat resistance are apt to deteriorate and when the average molecular weight is larger than 100,000, developability, particularly sensitivity often tends to degrade.

The above homopolymers of a radical polymerizable monomer having a phenolic hydroxyl group or carboxyl group and the above copolymers of the radical polymerizable monomer and another radical polymerizable monomer may be used alone or in combination of two or more.

Before polymerization, a protective group may be introduced into the carboxyl group or phenolic hydroxyl group and removed after polymerization to provide alkali solubility so as to synthesize an alkali soluble resin. Further, visible light transmission and softening point may be changed by hydrogenation.

As described above, a novolak resin, a homopolymer of a radical polymerizable monomer having a phenolic hydroxyl group or carboxyl group and a copolymer of the radical polymerizable monomer and another radical polymerizable monomer are preferably used as the alkali soluble resin (A) used in the present invention. Part of the alkali soluble resin (A) may be substituted with another phenolic compound.

The another phenolic compound used in the present invention is a phenolic compound having a molecular weight of 1,000 or less. When the molecular weight of the phenolic compound is larger than 1000, resolution degrades. Examples of the low-molecular weight phenolic compound include compounds having the following structures.

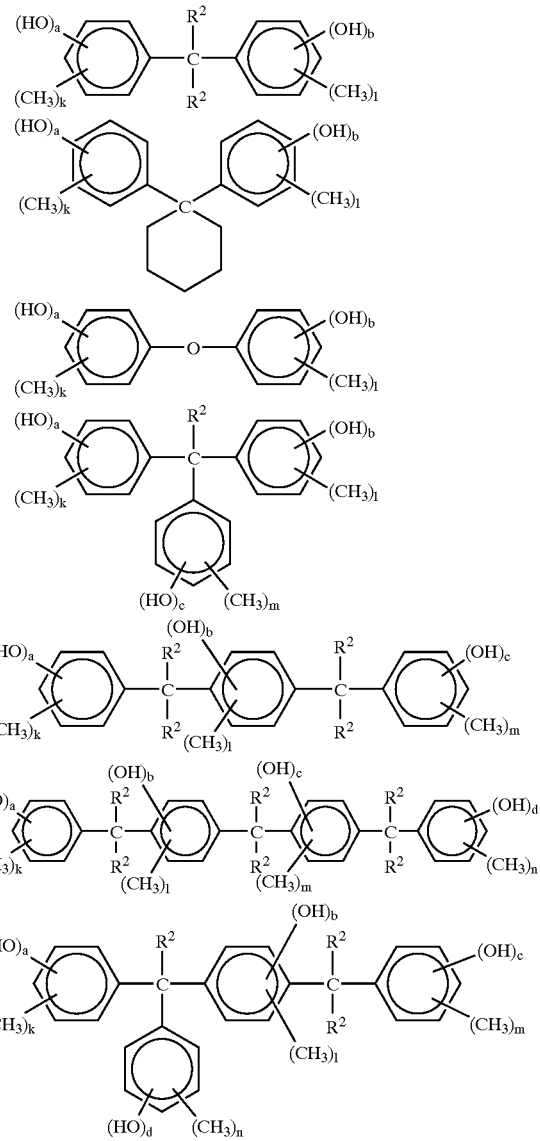

In the above formulas, $R^2$'s may be the same or different and each a hydrogen atom or methyl group, and a, b, c, d, k, l, m and n are each an integer of 0 to 3, with the proviso that $a+b+c+d \geq 2$.

When part of the alkali soluble resin (A) is substituted with another phenolic compound, the amount of the another phenolic compound is preferably 80 wt % or less, more preferably 50 wt % or less based on the total weight of the alkali soluble resin (A) and the another phenolic compound. When the amount of the another phenolic compound is larger than 80 wt %, a coating film may not be formed.

(B) Compound Represented by the Formula (I) to (IV)

Examples of the compounds represented by the above formulae (I) to (IV) include hexamethoxymethylolmelamine, hexabutoxymethylolmelamine, tetramethoxymethylolbenzoguanomine, tetramethoxymethylolguanamine, tetramethoxymethylolglycoluril. These compounds may be used alone or in admixture. And these compounds may be used as pure compound or as a mixture with an oligomer of such compound having a weight average molecular weight of 1,500 or less.

Out of these compounds, commercially available Cymel 300, 301, 303, 370, 325, 327, 701, 266, 267, 238, 1141, 272, 202, 1156, 1158, 1123, 1170, 1174, UFR65 and 300 (of Mitsui Cyanamid Co., Ltd.), Nikalack Mx-750, -032, -706, -708, -40 and -31, Nikalack Ms-11, and Nikalack Mw-30 (of Sanwa Chemical Co., Ltd.) are preferred.

The amount of the compound is preferably 1 to 100 parts by weight, more preferably 5 to 50 parts by weight based on 100 parts by weight of the alkali soluble resin (A). When the amount is smaller than 1 part by weight, film retention after development may lower and heat resistance and solvent resistance may deteriorate.

(C) Trihalomethyltriazine Represented by the Formula (V) or Onium Salt Serving as Optically Acid Generating Agent Represented by the Formula (VI)

Examples of the trihalomethyltriazine represented by the above formula (V) include 2,4,6-tris(trichloromethyl)-s-triazine,
2-phenyl-4,6-bis(trichloromethyl)-s-triazine,
2-(4-chlorophenyl)-4,6-bis(trichloromethyl)-s-triazine,
2-(3-chlorophenyl)-4,6-bis(trichloromethyl)-s-triazine,
2-(2-chlorophenyl)-4,6-bis(trichloromethyl)-s-triazine,
2-(4-methoxyphenyl)-4,6-bis(trichloromethyl)-s-triazine,
2-(3-methoxyphenyl)-4,6-bis(trichloromethyl)-s-triazine,
2-(2-methoxyphenyl)-4,6-bis(trichloromethyl)-s-triazine,
2-(4-methylthiophenyl)-4,6-bis(trichloromethyl)-s-triazine,
2-(3-methylthiophenyl)-4,6-bis(trichloromethyl)-s-triazine,
2-(2-methylthiophenyl)-4,6-bis(trichloromethyl)-s-triazine,
2-(4-methoxynaphthyl)-4,6-bis(trichloromethyl)-s-triazine,
2-(3-methoxynaphthyl)-4,6-bis(trichloromethyl)-s-triazine,
2-(2-methoxynaphthyl)-4,6-bis(trichloromethyl)-s-triazine,
2-(4-methoxy-$\beta$-styryl)-4,6-bis(trichloromethyl)-s-triazine,
2-(3-methoxy-$\beta$-styryl)-4,6-bis(trichloromethyl)-s-triazine,
2-(2-methoxy-$\beta$-styryl)-4,6-bis(trichloromethyl)-s-triazine,
2-(3,4,5-trimethoxy-$\beta$-styryl)-4,6-bis(trichloromethyl)-s-triazine,
2-(4-methylthio-$\beta$-styryl)-4, 6-bis (trichloromethyl)-s-triazine,
2-(3-methylthio-$\beta$-styryl)-4,6-bis(trichloromethyl) -s-triazine and
2-(2-methylthio-$\beta$-styryl)-4,6-bis(trichloromethyl)-s-triazine.

Examples of the onium salt represented by the above formula (VI) include diaryl iodonium salts such as diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenylindonium-p-toluene sulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, bis(4-ter-butylphenyl)iodonium tetrafluoroborate, bis(4-ter-butylphenyl)iodonium hexafluorophosphonate, bis(4-ter-butylphenyl)iodonium hexafluoroarsenate, bis(4-ter-butylphenyl)iodonium trifluoromethane sulfonate, bis(4-ter-butylphenyl)iodonium trifluoroacetate and bis(4-ter-butylphenyl)iodonium-p-toluene sulfonate; and triaryl sulfonium salts such as triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethane sulfonate, 4-phenylthiophenyldiphenyl trifluoroacetate and 4-phenylthiophenyldiphenyl-p-toluene sulfonate.

Out ofthese compounds,
2-(3-chlorophenyl)-4,6-bis(trichloromethyl)-s-triazine,
2-(4-methoxyphenyl)-4,6-bis(trichloromethyl)-s-triazine,
2-(4-methylthiophenyl)-4,6-bis(trichloromethyl)-s-triazine,
2-(4-methoxy-$\beta$-styryl)-4,6-bis(trichloromethyl)-s-triazine,
2-(4-methoxynaphthyl)-4,6-bis(trichloromethyl)-s-triazine,
diphenyliodonium trifluoroacetate,
diphenylindonium trifluoromethane sulfonate,
4-methoxyphenylphenyliodonium trifluoromethane sulfonate,
4-methoxyphenylphenyliodonium trifluoroacetate,
triphenylsulfonium trifluoromethane sulfonate,
triphenylsulfonium trifluoroacetate,
4-methoxyphenyldiphenylsulfonium trifluoromethane sulfonate, 4-methoxyphenyldiphenylsulfonium trifluoroacetate, 4-phenylthiophenyldiphenyl trifluoromethane sulfonate and 4-phenylthiophenyldiphenyl trifluoroacetate are preferred.

The amount of the compound represented by the above formula (V) or (VI) is preferably 0.001 to 10 parts by weight, more preferably 0.01 to 5 parts by weight based on 100 parts by weight of the alkali soluble resin (A). When the amount is smaller than 0.001 part by weight, the heat resistance and solvent resistance of the cathode separators may lower. When the amount is larger than 10 parts by weight, the control of the pattern shape after development may become difficult.

The compound represented by the formula (V) or (VI) may be used in conjunction with a suitable sensitizer. Examples of the sensitizer include coumarins having a substituent at least one position of the 3-position and 7-position, flavones, dibenzalacetones, dibenzalcyclohexanes, chalcones, xanthenes, thioxanthenes and porphylins and acridines. The amount of the ultraviolet light absorbing compound is preferably 20 parts or less by weight, more preferably 10 parts or less by weight based on 100 parts by weight of the alkali soluble resin (A). When the amount is larger than 20 parts by weight, the sensitizer tends to provide a filter effect, thereby making it difficult for radiation to reach the substrate.

Components other than the above components may be contained in the composition of the present invention as required in limits not prejudicial to the object of the present invention.

The other components include an ultraviolet light absorber, compound containing two or more epoxy groups in the molecule, surfactant, adhesion aid, keeping stabilizer and anti-foaming agent.

The above ultraviolet light absorber may be added mainly to obtain a good inversely tapered shape. The ultraviolet light absorbing compound used in the present invention absorbs light having a wavelength of less than 400 nm, particularly 365 nm, rarely absorbs visible light and is soluble in solvents to be described hereinafter. Examples of the ultraviolet light absorber include benzotriazoles, salicylates, benzophenones, substituted acrylonitriles, xanthenes, coumarins, flavones and chalcones. More specifically, Tinubin 234 (2-(2-hydroxy-3,5-bis($\alpha,\alpha$-dimethylbenzyl)phenyl)-2H-benzotriazole), Tinubin 571 (hydroxyphenylbenzotriazole derivative), Tinubin 1130 (condensate between methyl-3-(3-t-butyl-5-(2H-benzotriazol-2-yl)-4-hydroxyphenyl)propionate and polyethylene glycol (molecular weight of 300)) (of Chiba Specialty Chemicals Co., Ltd.), 1,7-bis(4-hydroxy-3-methoxyphenyl)-1,6-heptadiene-3,5-dione and dibenzylideneacetone are commercially available. The amount of the ultraviolet light absorber is preferably 20 parts or less by weight, more preferably 10 parts or less by weight based on 100 parts by weight of the alkali soluble resin (A). When the ultraviolet light absorber is added in an amount of more than 20 parts by weight, sensitivity is liable to lower.

The compound containing two or more epoxy groups in the molecule may be blended mainly to improve heat resistance and adhesion. Examples of the compound containing two or more epoxy groups in the molecule include bisphenol A epoxy resins such as Epicoat 1001, 1002, 1003, 1004, 1007, 1009, 1010 and 828 (of Yuka Shell Epoxy Co., Ltd.); bisphenol F epoxy resins such as Epicoat 807 (of Yuka Shell Epoxy Co., Ltd.); phenol novolak epoxy resins such as Epicoat 152 and 154 (of Yuka Shell Epoxy Co., Ltd.) and EPPN201 and 202 (of Nippon Kayaku Co., Ltd.); cresol novolak type epoxy resins such as EOCN-102, 103S, 104S, 1020, 1025 and 1027 (of Nippon Kayaku Co., Ltd.) and Epicoat 180S75 (of Yuka Shell Epoxy Co., Ltd.); cyclic aliphatic epoxy resins such as CY-175, 177 and 179 (of CIBA-GEIGY A.G), ERL-4234, 4299, 4221 and 4206 (of U.C.C. Co., Ltd.), Showdyne 509 (of Showa Denko K.K.), Araldyte CY-182, 192 and 184 (of CIBA-GEIGY A.G.), Epichlon 200 and 400 (of Dainippon Ink & Chemicals, Inc.), Epicoat 871 and 872 (of Yuka Shell Epoxy Co., Ltd.), and ED-5661 and 5662 (of Celaneas Coating Co., Ltd.); and aliphatic polyglycidyl ethers such as Epolite 100MF (of Kyoeisha Kagaku Co., Ltd.) and Epiol TMP (of NOF Corporation). Out of these, bisphenol A epoxy resins, bisphenol F epoxy resins, phenol novolak epoxy resins, cresol novolak epoxy resins and aliphatic polyglycidyl ethers are preferred.

A compound such as a glycidyl ether of bisphenol A or bisphenol F may also be suitably used. The amount of the compound containing two or more epoxy groups in the molecule is preferably 1 to 100 parts by weight, more preferably 5 to 50 parts by weight based on 100 parts by weight of the alkali soluble resin (A).

When a copolymer having a structural unit derived from a monomer containing an epoxy group such as glycidyl (meth)acrylate is used as the alkali soluble resin (A), it can be said that the component (A) is a "compound containing two or more epoxy groups in the molecule" but differs from the compound in that it is required to have alkali solubility and to be a relatively high molecular weight polymer.

The above surfactant may be blended to improve striation and the developability of a radiation exposed portion after the formation of a dried coating film. Examples of the surfactant include nonionic surfactants such as polyoxyethylene alkyl ethers including polyoxyethylene lauryl ether, polyoxyethylene stearyl ether and polyoxyethylene oleyl ether, polyoxyethylene aryl ethers including polyoxyethylene octylphenyl ether and polyoxyethylene nonylphenyl ether, and polyethylene glycol dialkyl esters including polyethylene glycol dilaurate and polyethylene glycol distearate; fluorine-based surfactants such as F Top EF301, 303 and 352 (of Shin Akita Kasei Co., Ltd.), Megafac F171, 172 and 173 (of Dainippon Ink & Chemicals, Inc.), Florade FC430 and 431 (of Sumitomo 3M Limited), Asahi Guard AG710, Surflon S-382, SC-101, 102, 103, 104, 105 and 106 (of Asahi Glass Co., Ltd.); organosiloxane polymer KP341 (of Shin-Etsu Chemical Co., Ltd.), and acrylic acid-based or methacrylic acid-based (co)polymer Polyflow No. 57 and 95 (of Kyoeisha Kagaku Co., Ltd.).

The amount of the surfactant is preferably 2 parts or less by weight, more preferably 1 part or less by weight based on 100 parts by weight of the total solid content of the composition.

Preparation of Radiation Sensitive Resin Composition

The radiation sensitive resin composition of the present invention is prepared by uniformly mixing together (A) an alkali soluble resin, (B) the compound represented by the above formulae (I) to (IV) and (C) a compound represented by the above formula (V) or (VI) and optionally used other additives. The radiation sensitive resin composition of the present invention is advantageously used as a solution prepared by dissolving the above components in a suitable solvent. For example, the radiation sensitive resin composition in a solution state can be prepared by mixing together (A) the alkali soluble resin, (B) the compound represented by the above formulae (I) to (IV) and (C) compound represented by the above formula (V) or (VI) and optionally added other compounding ingredients in a predetermined ratio.

The solvent used to prepare the radiation sensitive resin composition of the present invention uniformly dissolves (A) the alkali soluble resin, (B) the compound represented by the above formulas (I) to (IV) and (C) compound represented by the above formula (V) or (VI) and optionally added other additives and does not react with these components.

Examples of the solvent include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2- pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, methyl 3-butoxypropionate, ethyl 3-butoxypropionate, propyl 3-butoxypropionate and butyl 3-butoxypropionate.

Out of these solvents, glycol ethers, ethylene glycol alkyl ether acetates, propylene glycol alkyl ether acetates, esters and diethylene glycols are preferred from the viewpoints of solubility, reactivity with the above components and the formation ease of a coating film.

A high-boiling solvent may be used in conjunction with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzylethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The radiation sensitive resin composition of the present invention is prepared by using the above solvent and can be prepared to a suitable solid content according to its use purpose.

The solid content may be, for example, 10 to 50 wt %, preferably 20 to 40 wt %.

The composition solution prepared as described above may be filtered with a Millipore filter having a pore diameter of 0.5 μm before use.

Method of Forming Cathode Separator

The method of forming the cathode separator of the present invention from the radiation sensitive resin composition of the present invention will be detailed hereinbelow.

A coating film is formed by applying a solution of the radiation sensitive resin composition of the present invention to the surface of a substrate and heating to remove the solvent. Spray coating, roll coating and rotational coating may be used to apply the solution of the radiation sensitive resin composition to the surface of the substrate.

This coating film is then prebaked. The solvent is volatilized by heating to obtain a coating film having no fluidity.

The heating conditions which differ according to the type and amount of each component are preferably selected from a wide temperature range of 60 to 120° C. and a wide time range of 10 to 600 sec.

The obtained coating film of the radiation sensitive resin composition is exposed to radiation on the surface thereof through a mask having a predetermined pattern shape. The amount of energy of the radiation, that is, the type of the radiation is suitably determined according to desired resolution and wavelength to which the radiation sensitive compound is sensitive. For example, ultraviolet radiation such as g-line (wavelength of 436 nm), h-line (405 nm) and i-line (365 nm), deep ultraviolet ray such as excimer (KrF, ArF) laser light, X-ray such as synchrotron radiation, and charged corpuscular beams such as electron beams may be used, out of which g-line and i-line are preferred.

After exposure to radiation, PEB (post-exposure baking) is carried out before alkali development. The PEB temperature is preferably 200° C. or less and the PEB time is preferably 0.1 to 10 minutes. After PEB, the coating film is developed with a developer to remove unrequired portions.

As the developer may be used an aqueous solution of an alkali such as an inorganic alkali exemplified by sodium hydroxide, potassium hydroxide, sodium carbonate, sodium silicate, sodium metasilicate and ammonia water; primary amine exemplified by ethylamine and n-propylamine; secondary amine exemplified by diethylamine and di-n-propylamine; tertiary amine exemplified by triethylamine, methyldiethylamine and N-methylpyrrolidone; alcohol amine exemplified by dimethylethanolamine and triethanolamine; quaternary ammonium salt exemplified by tetramethylammonium hydroxide, tetraethylammonium hydroxide and choline; or cyclic amine exemplified by pyrrole, piperidine, 1,8-diazabicyclo[5.4.0]-7-undecene and 1,5-diazabicyclo[4.3.0]-5-nonane.

An aqueous solution prepared by adding a water-soluble organic solvent such as methanol or ethanol, or a surfactant to the above alkali aqueous solution in an appropriate amount may also be used.

The development time is, for example, 30 to 180 sec. and puddle development and dipping development may be used. After development, the developed coating film is washed with running water for 30 to 90 sec. and dried with compressed air or compressed nitrogen to remove water on the substrate to form a coating film pattern.

Subsequently, the coating film is heated at a predetermined temperature, for example, 150 to 250° C. by a heating unit such as a hot plate or oven for a predetermined time, for example, 5 to 30 minutes on the hot plate or 30 to 90 minutes in the oven to obtain a crosslinked film pattern.

The cathode separator of the present invention preferably has a trapezoidal cross section in an irradiation direction with the top side longer than the bottom side (inversely tapered shape), more preferably an angle formed between a straight line connecting the upper pattern edge and the lower pattern edge and the top side of 15 to 75°. Since the cross section of the cathode separator is inversely tapered, the deposition of an organic EL material from above and not an oblique direction is made possible. That is, the organic EL material is deposited from above so that it is uniformly adhered to an opening between adjacent cathode separators, thereby making it possible to secure sufficient brightness for a display device. When a cathode material is deposited from above, it can be prevented from being adhered to a lower portion of the inversely tapered shape, thereby making it possible to ensure insulation between cathodes.

The amount of a volatile component generated from the cathode separator of the present invention by heating at 25 to 200° C. is preferably 10 wt % or less, more preferably 5 wt % or less, much more preferably 2 wt % or less, particularly preferably 1 wt % or less.

By reducing the amount of the volatile component to the above range, the intrusion of impurities into the EL layer can be prevented, thereby making it possible to eliminate the occurrence of a lighting failure of the EL display device and a reduction in the brightness of emission.

The amount of the volatile component can be evaluated by TDS (Thermal Desorption Spectroscopy) measurement or the like.

Production of Organic EL Display Device

The organic EL display device of the present invention comprises cathode separators formed as described above. The organic EL display device of the present invention is produced as follows, for example.

A transparent electrode such as ITO is formed on a glass substrate by sputtering, and a positive photoresist is applied to the transparent electrode and prebaked. The resist is exposed through a mask and developed to form a resist pattern, the ITO film is etched by a hydrochloric acid-based etchant such as ferric chloride, and the resist film is removed to obtain a transparent electrode pattern, for example, a striped pattern. Thereafter, the radiation sensitive resin composition of the present invention is applied to the surface of the substrate having the transparent electrode pattern to form inversely tapered cathode separators as described above. Subsequently, a hole transfer layer, organic EL layer and cathode layer are formed by vapor deposition sequentially. The hole transfer layer is made from a phthalocyanine-based material such as CuPc or $H_2Pc$, or an aromatic amine. The organic EL material is prepared by doping a base material such as $Alq_3$ or $BeBq_3$ with quinacridone or coumarin. The cathode material is, for example, Mg—Al, Al—Li, Al—$Li_2O$ or Al—LiF.

An organic EL display device is then produced by sealing a hollow-structured stainless steel can and the above substrate with a sealing material such as an epoxy resin and assembling them into a module.

EXAMPLES

The following synthetic examples, examples and comparative examples are provided for the purpose of further illustrating the present invention but are in no way to be taken as limiting.

Synthesis Example 1 (Synthesis of Resin A-1)

176 g (0.1 mol) of t-butoxystyrene and 5.8 g (0.04 mol) of azobisbutyronitrile were placed in a flask equipped with a cooling tube, stirrer and thermometer, and 250 ml of propylene glycol monomethyl ether was added and dissolved to carry out polymerization at 75° C. for 4 hours. 50 g of a 5 wt % aqueous sulfuric acid solution was mixed with the obtained poly t-butoxystyrene solution to carry out a hydrolytic reaction at 100° C. for 3 hours. The reaction product was then washed with 1,000 ml of deionized water three times, and 500 ml of propylene glycol monomethyl ether acetate was added to carry out solvent substitution to obtain a solution containing an alkali soluble resin (A-1) (polyhydroxystyrene) having an Mw of 24,000.

Synthesis Example 2 (Synthesis of Resin A-2)

57 g (0.6 mol) of meta-cresol, 38 g (0.4 mol) of para-cresol, 75.5 g (0.93 mol of formaldehyde) of a 37 wt % formaldehyde aqueous solution, 0.63 g (0.005 mol) of oxalic dianhydride and 264 g of methylisobutyl ketone were charged into a flask equipped with a cooling tube, stirrer and thermometer, and the flask was immersed in an oil bath to carry out polycondensation for 4 hours under agitation while the reaction solution was refluxed. After the temperature of the oil bath was raised to 150° C. over 3 hours, the inside pressure of the flask was reduced to 30 to 50 mmHg to remove a volatile component and the molten resin A was recovered by cooling to room temperature. This resin was dissolved in ethyl acetate to a resin content of 30%, and methanol and water were added in amounts 1.3 times and 0.9 time the weight of the solution, respectively, stirred and left. Then, a lower layer out of two separated layers was taken out, concentrated and dried to obtain an alkali soluble resin (A-2) (novolak resin) having a Mw of 8,000.

Synthesis Example 3

5 parts by weight of 2,2'-azobis(2,4-dimethylvaleronitrile) and 200 parts by weight of diethylene glycol ethyl methyl ether were charged into a flask equipped with a cooling tube and stirrer. Subsequently, 25 parts by weight of styrene, 40 parts by weight of methacrylic acid and 30 parts by weight of tricycyclo $[5.2.1.0^{2.6}]$decan-8-yl methacrylate were added, the inside of the flask was substituted by nitrogen, and 5 parts by weight of 1,3-butadiene was added and stirred gently. The temperature of the resulting solution was raised to 70° C. and maintained at that temperature for 4 hours to obtain a polymer solution containing an alkali soluble resin (A-3) having a Mw of 12,000. The solid content of the obtained polymer solution was 33.5%.

Synthesis Example 4

7 parts by weight of 2,2'-azobis(2,4-dimethylvaleronitrile) and 200 parts by weight of diethylene glycol ethyl methyl ether were charged into a flask equipped with a cooling tube and stirrer. Subsequently, 10 parts by weight of styrene, 20 parts by weight of methacrylic acid, 45 parts by weight of glycidyl methacrylate and 25 parts by weight of tricycyclo $[5.2.1.0^{2.6}]$decan-8-yl methacrylate were added, the inside of the flask was substituted by nitrogen, and the resulting solution was stirred gently. The temperature of the resulting solution was raised to 70° C. and maintained at that temperature for 5 hours to obtain a polymer solution containing an alkali soluble resin (A-4) having a Mw of 10,000. The solid content of the obtained polymer solution was 33.5%.

Example 1

Preparation of Radiation Sensitive Resin Composition

The solution (corresponding to 100 parts by weight (solid content) of the resin (A-1)) containing the alkali soluble resin (A-1) obtained in Synthesis Example 1, 20 parts by weight of Cymel 300 (of Mitsui Cyanamid Co., Ltd.) as the component (B), 0.2 part by weight of 2-(4-methoxy-β-styryl)-4,6-bis(trichloromethyl)-s-triazine as the component (C), 10 parts by weight of Epicoat 152 as a compound containing two or more epoxy groups in the molecule (of Yuka Shell Epoxy Co., Ltd.) and 0.04 part by weight of Megafac F172 (of Dainippon Ink & Chemicals, Inc) as a surfactant were mixed together and dissolved in ethyl 3-ethoxypropionate to a solid content of 35 wt %, and the resulting solution was filtered with a Millipore filter having a pore diameter of 0.5 μm to prepare a radiation sensitive resin composition solution (S-1).

(I) Formation of Cathode Separators

The above composition solution (S-1) was applied to the surface of a glass substrate by a spinner and prebaked on a hot plate at 110° C. for 3 minutes to form a 5 μm thick coating film.

The above obtained coating film was exposed to ultraviolet radiation having an intensity of 10 mW/cm² at 365 nm through a pattern mask having 10 μm×10 μm openings for 10 seconds. This exposure was carried out in an oxygen atmosphere (in the air). Thereafter, this exposed coating film was developed with a 2.38 wt % aqueous solution of tetramethylammonium hydroxide at 25° C. for 90 seconds and washed with running pure water for 1 minutes. The formed cathode separators were heated in an oven at 220° C. for 60 minutes to be cured to obtain 4.5 μm thick cathode separators.

(II) Evaluation of Shape of Cathode Separator

The upper tapered angle of the sectional shape of the cathode separator obtained in (I) above (angle formed by a straight line connecting the upper pattern edge and the lower pattern edge and the top side of the trapezoidal cross section) is shown in Table 1. When this angle is 20 to 80°, it can be said that the cathode separator is satisfactory. When a cathode separator has a normally tapered cross section with an angle larger than 80°, or is rectangular with an angle of 90° or more, the cathode separator is not accepted.

(III) Evaluation of Heat Resistance

The cathode separators formed in (I) above were heated in an oven at 250° C. for 60 minutes. The dimensional change rate of film thickness is shown in Table 1. When the dimensional change rate before and after heating is within ±5%, it can be said that heat resistant dimensional stability is satisfactory.

(IV) Evaluation of Volatile Component

The observation of a volatile component of the cathode separators obtained in (I) above was evaluated by TDS measurement (EMD-WA 1000S of Denshi Kagaku Co., Ltd.). The measurement was carried out from 25° C. to 200° C. at a temperature elevation rate of 1° C./s. The results are shown in Table 1. As for the evaluation results, the amount of the volatile component generated is expressed by wt % by changing the cathode separator material to a substrate size of 10 mm×10 mm×4.5 μm.

Example 2

A composition solution (S-2) was prepared and evaluated in the same manner as in Example 1 except that 100 parts by weight of the alkali soluble resin (A-2) was used as the component (A). The results are shown in Table 1.

Example 3

A composition solution (S-3) was prepared and evaluated in the same manner as in Example 1 except that the solution containing an alkali soluble resin (A-3) (corresponding to 100 parts by weight (solid content) of the resin (A-3)) was used as the component (A). The results are shown in Table 1.

Example 4

A composition solution (S-4) was prepared and evaluated in the same manner as in Example 1 except that the solution containing an alkali soluble resin (A-4) (corresponding to 100 parts by weight (solid content) of the resin (A-4)) was used as the component (A). The results are shown in Table 1.

Example 5

A composition solution (S-5) was prepared and evaluated in the same manner as in Example 1 except that a mixture of the solution containing an alkali soluble resin (A-1) (corresponding to 80 parts by weight (solid content) of the resin (A-1)) and 20 parts by weight of bisphenol A were used as the component (A). The results are shown in Table 1.

Example 6

A composition solution (S-6) was prepared and evaluated in the same manner as in Example 1 except that a mixture of 80 parts by weight of the alkali soluble resin (A-2) and 20 parts by weight of bisphenol A was used as the component (A). The results are shown in Table 1.

Example 7

A composition solution (S-7) was prepared and evaluated in the same manner as in Example 1 except that 2 parts by weight of 1,7-bis(4-hydroxy-3-methoxyphenyl)-1,6-heptadien-3,5-dione was added as an ultraviolet light absorber. The results are shown in Table 1.

Example 8

A composition solution (S-8) was prepared and evaluated in the same manner as in Example 2 except that 2 parts by weight of 1,7-bis(4-hydroxy-3-methoxyphenyl)-1,6-heptadien-3,5-dione was added as an ultraviolet light absorber. The results are shown in Table 1.

Example 9

A composition solution (S-9) was prepared and evaluated in the same manner as in Example 1 except that 20 parts by weight of Cymel 1174 (of Mitsui Cyanamid Co., Ltd.) was used as the component (B) instead of 20 parts by weight of Cymel 300. The results are shown in Table 1.

TABLE 1

|  | tapered angle | heat resistance (%) | volatile component (%) |
| --- | --- | --- | --- |
| Ex. 1 | 55 | −4 | 1.3 |
| Ex. 2 | 50 | −5 | 1.6 |
| Ex. 3 | 50 | −3 | 0.9 |
| Ex. 4 | 50 | −4 | 0.8 |
| Ex. 5 | 45 | −4 | 1.3 |
| Ex. 6 | 45 | −5 | 1.6 |
| Ex. 7 | 35 | −4 | 1.3 |
| Ex. 8 | 35 | −5 | 1.6 |
| Ex. 9 | 50 | −5 | 2.0 |

Ex.: Example

As described above, according to the present invention, there is provided a radiation sensitive resin composition which is capable of easily forming cathode separators having excellent performance such as an inversely tapered shape, heat resistance and low volatility.

Highly reliable cathode separators are obtained from the above radiation sensitive resin composition.

What is claimed is:

1. A cathode separator for EL display devices formed from a radiation sensitive composition comprising:
    (A) an alkali soluble resin;
    (B) at least one compound selected from the group consisting of a compound represented by the following formula (I):

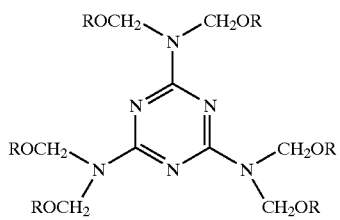

(I)

wherein six Rs may be the same or different and each a hydrogen atom or an alkyl group having 1 to 6 carbon atoms, a compound represented by the following formula (II):

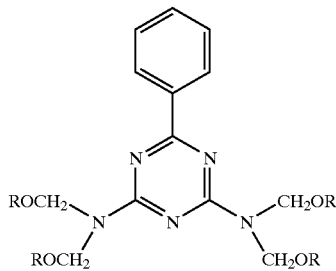

(II)

wherein Rs are defined as above, a compound represented by the following formula (III):

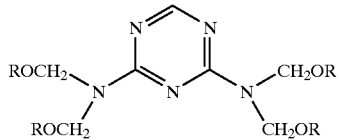

(III)

wherein Rs are defined as above, and a compound represented by the following formula (IV):

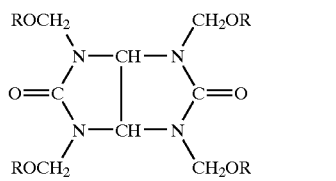

(IV)

wherein Rs are defined as above;

(C) a trihalomethyltriazine represented by the following formula (V):

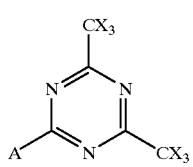

(V)

wherein X is a halogen atom and A is $CX_3$ or a group represented by the following formula:

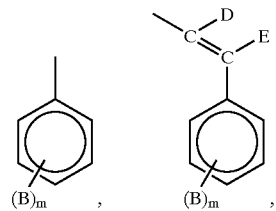

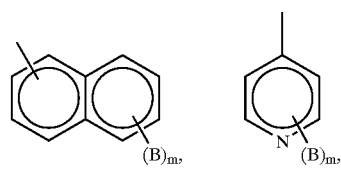

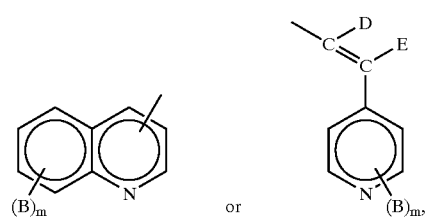

B, D and E are each independently a hydrogen atom, alkyl group, alkoxy group, aryloxy group, thioalkyl group, or having 1 to 10 carbon atoms, halogen atom, cyano group, nitro group, secondary amino group having an alkyl group with 1 to 10 carbon atoms, carboxyl group, hydroxyl group, ketoalkyl group or ketoaryl group having 1 to 10 carbon atoms, or alkoxycarbonyl group or alkylcarbonyloxy group having 1 to 20 carbon atoms, and m is an integer of 1 to 5, or an onium salt which serves as an optically acid generating agent represented by the following formula (VI):

$(A)_n Z^+ Y^-$        (VI)

wherein A is as defined hereinabove, Z is sulfur or iodine, Y is $BF_4$, $PF_6$, $SbF_6$, $AsF_6$, p-toluene sulfonate, trifluoromethane sulfonate or trifluoroacetate, and n is 2 or 3, and 1,7-bis(4-hydroxy-3-methoxyphenyl)-1,6-heptadiene-3,5-dione added as an ultraviolet light absorber.

2. The cathode separator for EL display devices according to claim 1, wherein the amount of a volatile component generated by heating at 25 to 200° C. is 10% or less of weight of the cathode separator.

3. The cathode separator for EL display devices according to claim 1, wherein component (B) is hexamethoxymethylolmelamine, hexabutoxymethylolmelamine, tetramethoxymethylolbenzoguanamine, tetramethoxymethylolguanamine, or tetramethoxymethylolglycoluril.

4. The cathode separator for EL display devices according to claim 1, wherein component (C) is 2-(4-methoxy-β-styryl)-4,6-bis(trichloromethyl)-s-triazine.

\* \* \* \* \*